United States Patent
Fukutani et al.

(10) Patent No.: US 7,070,855 B2
(45) Date of Patent: Jul. 4, 2006

(54) POROUS MATERIAL AND PRODUCTION PROCESS THEREOF

(75) Inventors: Kazuhiko Fukutani, Kanagawa (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 84 days.

(21) Appl. No.: 10/653,978

(22) Filed: Sep. 4, 2003

(65) Prior Publication Data

US 2004/0043208 A1 Mar. 4, 2004

Related U.S. Application Data

(63) Continuation of application No. PCT/JP03/02999, filed on Mar. 13, 2003.

(30) Foreign Application Priority Data

Mar. 15, 2002 (JP) ............... 2002-073111
Dec. 13, 2002 (JP) ............... 2002-363164

(51) Int. Cl.
*B32B 3/00* (2006.01)

(52) U.S. Cl. ............... 428/312.2; 428/312.6; 428/312.8; 428/314.2; 428/315.5; 428/315.7; 428/318.4; 428/446; 428/634; 428/641; 428/620; 977/DIG. 1

(58) Field of Classification Search ............ 428/312.2, 428/312.6, 312.8, 314.2, 315.5, 315.7, 318.4, 428/446, 620, 634, 641; 977/DIG. 1
See application file for complete search history.

(56) References Cited

U.S. PATENT DOCUMENTS

| 5,244,828 | A |   | 9/1993  | Okada et al. ............... 437/81 |
| 5,858,457 | A | * | 1/1999  | Brinker et al. ............ 427/162 |
| 6,027,796 | A |   | 2/2000  | Kondoh et al. ........... 428/312.8 |
| 6,214,738 | B1 |   | 4/2001  | Aiba et al. ................ 438/707 |
| 6,265,321 | B1 | * | 7/2001 | Chooi et al. .............. 438/725 |
| 6,464,853 | B1 |   | 10/2002 | Iwasaki et al. ............ 205/118 |
| 6,525,461 | B1 |   | 2/2003  | Iwasaki et al. ............ 313/495 |
| 6,541,386 | B1 |   | 4/2003  | Aiba et al. ................ 438/707 |
| 6,602,620 | B1 |   | 8/2003  | Kikitsu et al. .......... 428/694 T |
| 6,610,463 | B1 |   | 8/2003  | Ohkura et al. ............. 430/322 |
| 2001/0036563 | A1 |   | 11/2001 | Watanabe et al. ....... 428/694 T |
| 2002/0014621 | A1 |   | 2/2002  | Den et al. .................... 257/3 |
| 2002/0031008 | A1 |   | 3/2002  | Den et al. .................. 365/173 |
| 2002/0086185 | A1 |   | 7/2002  | Yasui et al. ............ 428/694 TS |
| 2003/0001150 | A1 |   | 1/2003  | Iwasaki et al. ................ 257/3 |

(Continued)

FOREIGN PATENT DOCUMENTS

| JP | 52-78403  | 7/1977 |
| JP | 62-270473 | 11/1987 |
| JP | 63-220411 | 9/1988 |

(Continued)

OTHER PUBLICATIONS

M. Jacobs et al., "Unbalanced Magnetron Sputtered Si-Al Coatings: Plasma Conditions and Film Properties Versus Sample Bias Voltage," 116-119 *Surface and Coatings Technology* 735-41 (1999).

C.D. Adams et al., "Phase Separation During Co-Deposition of Al-Ge Thin Films," 7(3) *J. Mater. Res.* 653-67 (Mar. 1992).

(Continued)

*Primary Examiner*—Ling Xu
(74) *Attorney, Agent, or Firm*—Fitzpatrick, Cella, Harper & Scinto

(57) ABSTRACT

There are provided a porous material and a process for producing the same. The porous material has a plurality of columnar pores and an area surrounding the pores, and the area is an amorphous area containing C, Si, Ge or a combination thereof.

7 Claims, 6 Drawing Sheets

U.S. PATENT DOCUMENTS

| | | | |
|---|---|---|---|
| 2004/0001964 A1 | 1/2004 | Ohkura et al. | 428/596 |
| 2004/0048092 A1 | 3/2004 | Yasui et al. | 428/642 |
| 2005/0053773 A1 | 3/2005 | Fukutani et al. | 428/209 |

FOREIGN PATENT DOCUMENTS

| | | |
|---|---|---|
| JP | 5-55545 | 3/1993 |
| JP | 7-73429 | 3/1995 |
| JP | 9-157062 | 6/1997 |
| JP | 2001-101644 | 4/2001 |
| JP | 2001-261376 | 9/2001 |
| JP | 2001-273622 | 10/2001 |
| WO | WO 03/069677 A1 | 8/2003 |
| WO | WO 03/078685 A1 | 9/2003 |

OTHER PUBLICATIONS

C.D. Adams et al., "Transition from Lateral to Transverse Phase Separation During Film Co-deposition," 59(20) *Appl. Phys. Lett.* 2535-37 (Nov. 1991).

M. Atzmon et al., "Phase Separation During Film Growth," 42(2) *J. Appl. Phys.* 442-46 (Jul. 1992).

C.D. Adams, et al. "Monte Carlo Simulation of Phase Separation During Thin-Film Codeposition," 74(3) *J. Appl. Phys.* 1707-15 (Aug. 1993).

M. Atzmon et al., "Phase Separation During Film Growth," 72(2) *J. Appl. Phys.* 442-446 (Jul. 1992).*

* cited by examiner

FIG. 4A  |  STEP OF PREPARING FIRST MATERIAL AND SECOND MATERIAL

POROUS MATERIAL AND PRODUCTION PROCESS THEREOF

This application is a continuation of International Application No. PCT/JP03/02999, filed on Mar. 13, 2003, which claims the benefit of Japanese Patent Application Nos. 2002-073111, filed on Mar. 15, 2002, and 2002-363164, filed on Dec. 13, 2002.

BACKGROUND OF THE INVENTION

1. Field of the Invention

The present invention relates to a porous material and a production process thereof.

2. Related Background Art

Much attention has recently been paid to microstructures as functional materials. Techniques for producing such microstructures include a technique for directly manufacturing a microstructure by semiconductor processing technology typified by pattern forming technology such as photolithography (refer to JP 5-55545 A).

Besides the above semiconductor processing technology, there is a technique making use of the self-organization phenomenon or self-formation phenomenon of a material. That is, a novel microstructure is to be realized based on a naturally formed regular structure.

SUMMARY OF THE INVENTION

Since the technique making use of the self-organization or self-formation phenomenon has the potential of producing not only a micron-scale structure, but also a nano-scale structure, this technique has been explored in many researches. However, it cannot be said that the technique has been completely established, and a novel microstructure and the establishment of its production process are still desired.

It is therefore an object of the present invention to provide a novel structure and a production process thereof.

According to an aspect of the present invention, there is provided a porous material comprising a plurality of columnar pores and an area that surrounds the pores, wherein the area is an amorphous area containing C, Si, Ge or a combination thereof.

It is preferable that the columnar pores are substantially unbranched.

It is preferable that the average interval between the centers of adjacent pores is 30 nm or less, and that the diameter of each of the columnar pores is 20 nm or less.

Further, it is preferable that the plurality of pores have substantially the same depth direction.

Note that the area may contain aluminum.

Note that when the porous material is formed on a substrate, there is obtained a porous material in which the depth directions of the columnar pores are substantially perpendicular to the substrate.

Further, according to another aspect the present invention, there is provided a porous material obtained by removing a first material from a structure including the first material and a second material, wherein the structure has columnar members containing the first material and surrounded by an amorphous area containing the second material, and that the structure contains the second material in an amount of 20 to 70 atomic % based on the total amount of the first material and the second material.

The first material is aluminum, for example. The second material is, for example, Si, Ge, SiGe, C or a combination thereof.

Further, according to another aspect of the present invention, there is provided a process for producing a porous material comprising the steps of: preparing a structure which contains a first material and a second material and has columnar members containing the first material and surrounded by an area containing the second material; and removing the columnar members from the structure.

Here, it is preferable that the structure contains the second material in an amount of 20 to 70 atomic % based on the total amount of the first material and the second material.

The diameters of pores formed by the removing step may be increased after the removing step.

Further, according to another aspect of the present invention, there is provided a process for producing a porous material comprising the steps of: preparing a structure which contains aluminum and silicon, has columnar members containing aluminum and a silicon area surrounding the columnar members, and contains silicon in an amount of 20 to 70 atomic % based on the total amount of aluminum and silicon; and removing the columnar members from the structure.

The silicon area may contain germanium.

The use of the above porous material permits provision of a filter or a mask.

Further, according to yet another aspect of the present invention, there is provided a porous material having columnar pores and an area surrounding the pores, wherein the average diameter of the pores is 20 nm or less and the average interval between the pores is 30 nm or less.

Further, according to still another aspect of the present invention, there is provided a process for producing a porous material comprising the steps of: preparing a structure which contains a first material and a second material and has columnar members containing the first material and surrounded by an area containing the second material, and which contains the second material in an amount of 20 to 70 atomic % based on the total amount of the first material and the second material; and removing the columnar members from the structure.

According to still another aspect of the present invention, there is provided a porous material comprising columnar pores and an area surrounding the pores, in which a first material (for example, aluminum) is contained in the area in an amount of 1 to 20% based on the total amount of the first material and a second material. The units are atomic %.

The above amount is the amount of aluminum contained in a Si porous material when the first material is aluminum and the second material is silicon. This does not include the amount of oxygen contained in the porous material.

BRIEF DESCRIPTION OF THE DRAWINGS

FIGS. 4A, 4B, 4C and 4D are diagrams for explaining an example of a process for producing a porous material according to the present invention;

DESCRIPTION OF THE PREFERRED EMBODIMENTS

Figure 1A:
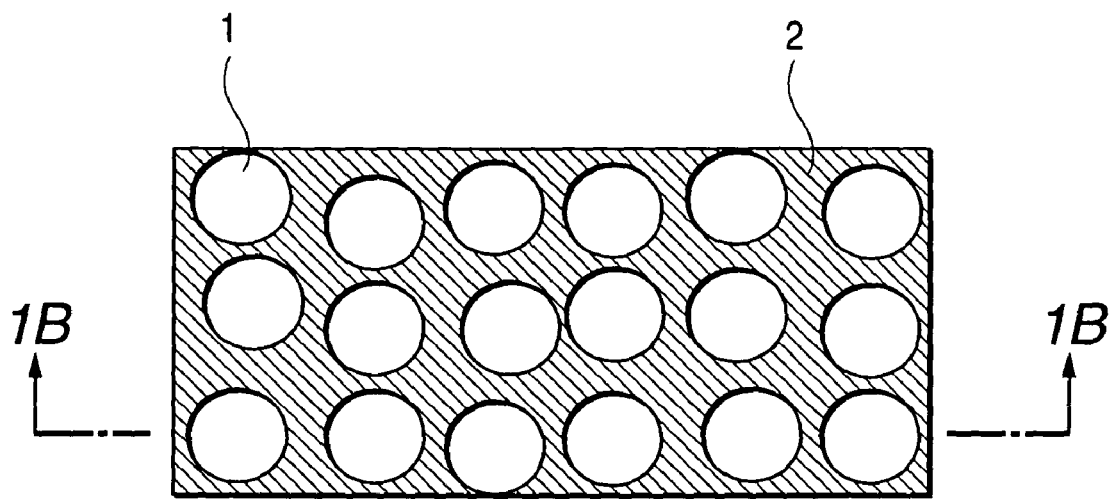
FIGS. 1A and 1B are schematic diagrams of a porous material according to the present invention.

The present invention will now be described in detail.

Initially, a description is provided of a structure applicable for use in the present invention.

(1) Structure Applicable for Use in the Present Invention

The structure applicable for use in the present invention includes a first material and a second material, in which structure columnar members containing the first material are surrounded by an area containing the second material. The second material in the structure comprises 20 to 70 atomic % of the total amount of the first material and the second material. A porous material according to the present invention is obtained by removing the above columnar members from this structure. When the porous material is left in an atmosphere including oxygen, such as air, an oxide area is readily formed on the surface layer (the surface of a film or the wall of each pore) of the porous material.

The above amount refers to the amount of the second material based on the total amount of the first material and the second material forming the structure. It is preferably 25 to 65 atomic %, more preferably 30 to 60 atomic %.

When a substantially columnar form needs to be obtained, the second material may be contained as a component of the columnar members, and the first material (for example, aluminum, as will be described below) may be contained in the above area. Oxygen, argon and the like may be contained in the above columnar members and the area surrounding the members.

The above amount is determined, for example, by inductive coupled plasma emission spectral analysis. The unit of atomic % is used. When the unit of wt % is used, 20 to 70 atomic % is equivalent to 20.65 to 70.84 wt % (the atomic weight of Al is 26.982 and the atomic weight of Si is 28.086).

Examples of the first material include Al, Au, Ag and Mg. Examples of the second material include Si, Ge, $Si_xGe_{1-x}$ and C. The second material is preferably a material which can be amorphous. The first material and the second material are preferably materials (so-called eutectic materials) having a eutectic temperature in the phase diagrams of both components. The eutectic temperature is 300° C. or higher, preferably 400° C. or higher. A eutectoid material may also be used. A preferred combination of the first material and the second material includes that in which Al is used as the first material and Si is used as the second material, in which Al is used as the first material and Ge is used as the second material, or in which Al is used as the first material and $Si_xGe_{1-x}$ (0<x<1) is used as the second material. The amount of the first material (for example, aluminum) contained in the above area forming the above porous material is preferably 1 to 20 atomic %. This amount refers to the amount of aluminum contained in the Si porous material when the first material is aluminum and the second material is silicon. This amount does not include the amount of oxygen contained in the porous material.

The area surrounding the above columnar members is desirably amorphous.

The plane form of each columnar member is circular or oval.

The above structure has a plurality of the above columnar members dispersed in a matrix containing the second material. The size (diameter when the plane form is circular) of each columnar member can be controlled mainly by the composition (that is, the amount of the second material) of the above structure. The average diameter of the columnar members is 0.5 to 50 nm, preferably 0.5 to 20 nm, more preferably 0.5 to 10 nm. The diameter is represented by $2r$ in FIG. 1B. When the plane form is oval or the like, the longest outer diameter needs to be within the above range. The average diameter is obtained from the actual SEM photo (about 100 nm×100 nm) of the columnar portions directly or after processing the image using a computer. The lower limit of the average diameter, which depends on which device the above structure is used for or how the structure is processed, is 1 nm or several nanometers from the viewpoint of practical use.

The interval $2R$ between the centers of adjacent columnar members (FIG. 1B) is 2 to 30 nm, preferably 5 to 20 nm, more preferably 5 to 15 nm. The lower limit of the interval $2R$ must be such that the columnar members do not contact each other.

Preferably, the above pore diameter is 20 nm or less and the interval between the centers of adjacent pores is 30 nm or less.

The above structure is preferably a film-like structure. In this case, the above columnar members are dispersed in the matrix containing the second material in such a manner that they are substantially perpendicular to the plane direction of the film. The thickness of the film-like structure is not particularly limited, but is suitably 1 nm to 100 μm. In consideration of the process time and the like, the practical thickness of the film is 1 nm to 1 μm. It is preferred that even when the thickness of the film is 300 nm or more, columnar structures be maintained. The columnar members are columnar structures having substantially no branches in the thickness direction.

The above structure is preferably a film-like structure and may be formed on a substrate. The substrate is not particularly limited. Examples of the substrate include insulating substrates made from quartz glass or the like, a silicon substrate, semiconductor substrates made from gallium arsenide or indium phosphide, metal substrates made from aluminum or the like, and flexible substrates (made from a polyimide resin or the like) as support members on which the above structure can be formed. The above columnar members are formed to be substantially perpendicular to the substrate.

The above structure can be manufactured by using a process for forming a film under a non-equilibrium condition. The above film forming process is preferably sputtering, but any film forming process for forming a substance under a non-equilibrium condition can be used, such as resistance heating deposition, electron beam deposition (EB deposition) or ion plating. For sputtering magnetron sputtering, RF sputtering, ECR sputtering or DC sputtering may be used. When sputtering is used, film formation can be carried out by setting the inside pressure of a reactor to 0.2 to 1 Pa in an argon atmosphere. For sputtering, the above first material and second material may be prepared separately as target raw materials, or a target material obtained by baking in advance the first material and the second material at a desired ratio may be used. Sputtering is preferably carried out under such conditions, that plasma does not substantially contact the substrate from which the above structure grows.

The above structure is desirably formed on the substrate at a substrate temperature of 20 to 300° C., preferably 20 to 200° C., more preferably 100 to 150° C.

A porous material having a plurality of columnar pores is formed by removing (wet etching or dry etching) the above columnar members from the above structure. Etching is used to selectively remove the columnar members, and the etchant is preferably an acid, such as phosphoric acid, sulfuric acid, hydrochloric acid or nitric acid. The pores of the porous material formed by removing the columnar members are preferably not connected to one another, but are independent. The plurality of the formed pores have the same depth direction.

When the porous material is exposed to an atmosphere (liquid or gas) containing oxygen, an oxide area is readily formed on the wall of each pore. Therefore, an oxide area may be positively formed on the wall of each pore of the porous material.

(2) A description is subsequently provided of the ratio of the first material (forming the columnar members) to the second material (forming the area surrounding the columnar members) in the structure applicable for use in the present invention.

The reason why the porous material of the present invention can be provided is that the following structure could be obtained by intensive efforts made by the inventors of the present invention.

Figure 5:
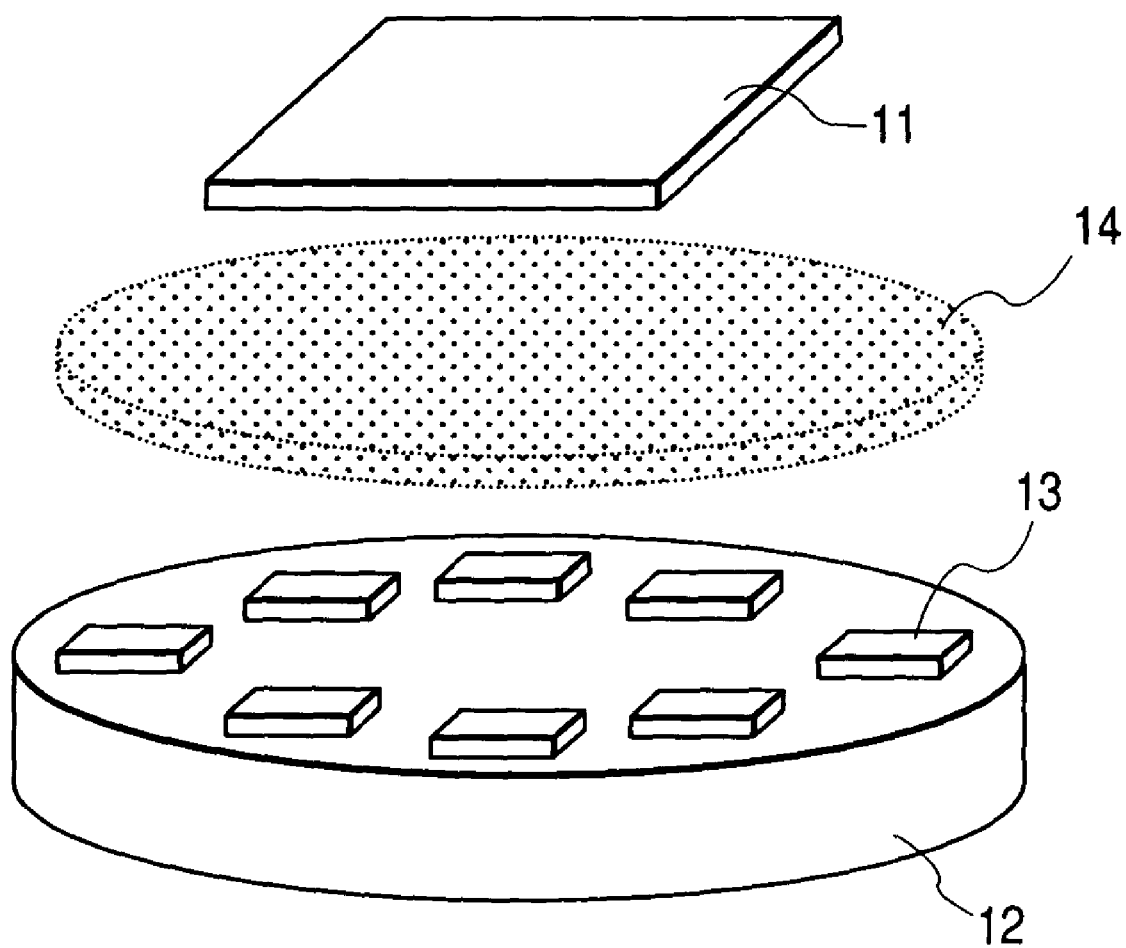
FIG. 5 is a schematic diagram showing a film forming process for the structure of the present invention.

An aluminum-silicon mixed film which contained silicon in an amount of 55 atomic % based on the total amount of aluminum and silicon was formed on a glass substrate 11 to a thickness of about 200 nm by RF magnetron sputtering. As shown in FIG. 5, a 4-inch aluminum target having eight 15 mm-square silicon chips 13 mounted thereon was used as a target. As for sputtering conditions, an RF power source was used, the flow rate of Ar was 50 sccm, the discharge pressure was 0.7 Pa, and the input power was 1 kW. The substrate temperature was room temperature.

The aluminum target as the target 12 had eight silicon chips 13 mounted thereon. The number of silicon chips is not limited to 8 and may change according to sputtering conditions if the silicon content in the aluminum-silicon mixed film is about 55 atomic %. The target is not limited to an aluminum target having silicon chips mounted thereon and may be a silicon target having aluminum chips mounted thereon or a target obtained by sintering silicon and aluminum powders.

The thus obtained aluminum-silicon mixed film was analyzed by ICP (inductive coupled plasma emission spectral analysis) to measure the amount (atomic %) of silicon based on the total amount of silicon and aluminum. As a result, the amount of silicon was about 55 atomic % based on the total amount of silicon and aluminum. For the convenience of measurement, an aluminum-silicon mixed film deposited on a carbon substrate was used as a substrate.

The aluminum-silicon mixed film was observed through an FE-SEM (field emission scanning electron microscope). Circular aluminum nano-structures surrounded by silicon were arranged two-dimensionally. The diameter of each aluminum nano-structure portion was 3 nm and the average interval between the centers of adjacent nano-structure portions was 7 nm. When the section of each nano-structure portion was observed through FE-SEM, the height thereof was 200 nm and the aluminum nano-structure portions were independent from one another.

When this specimen was observed by an X-ray diffraction method, a peak showing the crystallinity of silicon could not be observed and silicon was amorphous. A plurality of peaks showing the crystallinity of aluminum could be seen, which means that at least a part of aluminum was a polycrystal.

Accordingly, an aluminum silicon nano-structure containing aluminum nano-cylinder surrounded by silicon and having an interval 2R of 7 nm, a diameter 2r of 3 nm and a height L of 200 nm could be manufactured.

Thus, the inventors of the present invention have found that an aluminum-silicon nanostructure having aluminum nano-structure, such as aluminum quantum dots or aluminum quantum wires having a scale of several nanometers in a silicon matrix on the surface of a substrate, is manufactured by forming an aluminum-silicon mixed film in accordance with a film forming process for forming a substance under a non-equilibrium condition, such as sputtering.

COMPARATIVE EXAMPLE

As a comparative specimen A, an aluminum-silicon mixed film which contained 15 atomic % of silicon based on the total amount of aluminum and silicon was formed on a glass substrate to a thickness of about 200 nm by sputtering. A 4-inch aluminum target having two 15 mm-square silicon chips 13 mounted thereon was used as a target. As for sputtering conditions, an RF power source was used, the flow rate of Ar was 50 sccm, the discharge pressure was 0.7 Pa, and the input power was 1 kW. The substrate temperature was room temperature.

The comparative specimen A was observed through FE-SEM (field emission scanning electron microscope). When the surface of the specimen was examined from above the substrate, aluminum portions were not circular and were continuously connected to one another. That is, a microstructure in which aluminum columnar structures were uniformly dispersed in a silicon area was not obtained. The size of each aluminum columnar structure was much larger than 10 nm. When the section of the structure was observed through FE-SEM, the width of the aluminum portion was larger than 15 nm. The thus obtained aluminum-silicon mixed film was analyzed by ICP (inductive coupled plasma emission spectral analysis) to measure the amount (atomic %) of silicon based on the total amount of aluminum and silicon. As a result, the amount of silicon was about 15 atomic % based on the total of aluminum and silicon.

Further, an aluminum-silicon mixed film containing silicon in an amount of 75 atomic % based on the total amount of aluminum and silicon was formed on a glass substrate to a thickness of about 200 nm by sputtering as a comparative specimen B. A 4-inch aluminum target having fourteen 15 mm-square silicon chips 13 mounted thereon was used as a target. As for sputtering conditions, an RF power source was used, the flow rate of Ar was 50 sccm, the discharge pressure was 0.7 Pa, and the input power was 1 kW. The substrate temperature was room temperature.

The comparative specimen B was observed through FE-SEM (field emission scanning electron microscope). When the surface of the specimen was examined from above the substrate, aluminum portions could not be observed. Even when the section of the specimen was observed through FE-SEM, the aluminum portions could not be clearly observed. The thus obtained aluminum-silicon mixed film was analyzed by ICP (inductive coupled plasma emission spectral analysis) to measure the amount (atomic %) of silicon based on the total amount of silicon and aluminum. As a result, the amount of silicon was about 75 atomic % based on the total amount of silicon and aluminum.

Specimens which contained silicon in amounts of 20 atomic %, 35 atomic %, 50 atomic %, 60 atomic % and 70 atomic % based on the total amount of silicon and aluminum were manufactured in the same manner as the comparative specimen A, except that the number of silicon chips was changed. In Table 1, symbol "○" indicates that a microstructure in which aluminum columnar structures were dispersed in a silicon area was obtained and "x" indicates that such a microstructure was not obtained. The amount of silicon is preferably 30 to 60 atomic % in terms of the uniformity of the columnar structures. When the amount of silicon is 65 or 70 atomic %, aluminum had low crystallinity and was almost amorphous.

TABLE 1

| Amount of silicon (atomic %) | Microstructure |
|---|---|
| 15 (comparative specimen A) | X |
| 20 | ○ |
| 25 | ○ |
| 35 | ○ |
| 50 | ○ |
| 55 | ○ |
| 60 | ○ |
| 65 | ○ |
| 70 | ○ |
| 75 (Comparative specimen B) | X |

A structure in which aluminum columnar structures are dispersed in a silicon area can be achieved by adjusting the amount of silicon to 20 to 70 atomic % based on the total of aluminum and silicon. By changing the ratio of aluminum and silicon, the diameter of each columnar structure can be controlled, thereby making it possible to manufacture thin, highly linear aluminum wires. TEM (transmission electron microscope) may be used besides SEM to identify the structure.

Further, an aluminum-silicon mixed film containing silicon in an amount of 55 atomic % based on the total amount of silicon and aluminum was formed on a glass substrate to a thickness of about 200 nm by sputtering as a comparative specimen C. A 4-inch aluminum target having eight 15 mm-square silicon chips 13 mounted thereon was used as the target. As for sputtering conditions, an RF power source was used, the flow rate of Ar was 50 sccm, the discharge pressure was 0.7 Pa, and the input power was 1 kW. The substrate temperature was 350° C.

The comparative specimen C was observed through FE-SEM (field emission scanning electron microscope). When the surface of the specimen was viewed from above the substrate, large aluminum blocks could be observed. It was confirmed by X-ray diffraction measurement that silicon was crystallized. That is, columnar aluminum nano-structures could not be identified and the silicon area was not amorphous but crystallized. That is, when the substrate temperature is too high, film growth for forming the above aluminum nano-structures is impossible, because aluminum becomes more stable.

In order to obtain a structure having columnar members dispersed therein, it is preferred to set the Al/Si ratio of the target to 55:45.

The case where aluminum was used as the first material and silicon was used as the second material has been described. The same result was obtained when the above-described materials, which can be used as the first or second material, were used.

The porous material and the production process thereof according to the present invention making use of the above structure is described below.

(3) Porous Material of the Present Invention

The porous material of the present invention has a plurality of columnar pores and an area surrounding the pores. The area is an amorphous area containing C, Si, Ge or a combination thereof.

Figure 1B:
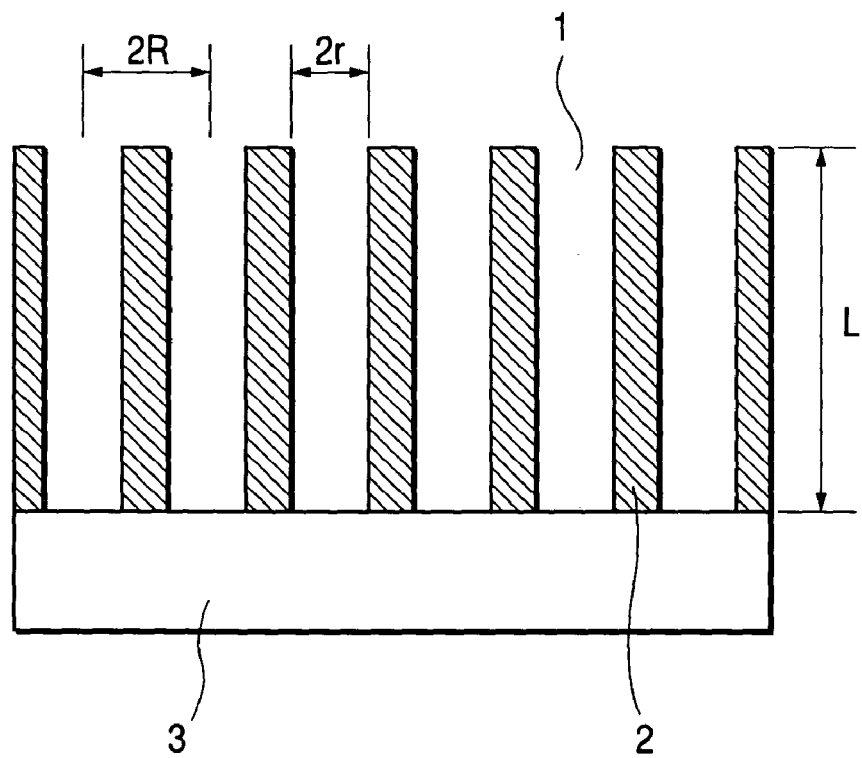

In FIG. 1A, reference numeral 1 denotes a plurality of columnar pores; and 2, an area surrounding them (formed from C, Si, Ge or a combination thereof). Denoted by reference numeral 3 is a substrate. FIG. 1B is a schematic sectional view of the porous material cut along broken line 1B—1B in FIG. 1A.

As shown in FIG. 1B, according to the present invention, a porous material having substantially unbranched pores is obtained. As can be observed in FIG. 1B, the pores are independent from one another and perpendicular or almost perpendicular to the film surface (or substrate).

According to the present invention, the average interval between the centers of adjacent pores (2R in FIG. 1B) can be set to 30 nm or less and the average diameter of the columnar pores can be set to 20 nm or less (2r in FIG. 1B). Preferably, the pore diameter 2r is 0.5 to 15 nm, and the interval 2R between the centers of adjacent pores is 5 to 20 nm. The length L is 0.5 nm to several micrometers, preferably 2 nm to 5 μm. The average diameter of the pores means the average diameter of long axes obtained by processing (picking out) an image of the pores observed from the actual SEM photo (about 100 nm×100 nm) using a computer and analyzing the image based on the assumption that the pores are oval.

The pores in the porous material of the present invention can be directly connected to the substrate as shown in FIG. 1B. The present invention is not limited to this structure, and the pores are not necessarily connected to the substrate.

The area 2 forming the porous material of the present invention contains the second material as the main component, but it may contain other elements, such as aluminum (Al), oxygen (O) and argon (Ar) in an amount of several to several tens of atomic %. In particular, when a columnar member containing the above first material, such as aluminum, is present at a position where a columnar pore is present, aluminum and the like are present in the porous material. The concentration of the first material forming the columnar members is high near the wall surface of each pore of the porous material and low in the interior of the wall of the pore. That is, the first material contained in the porous material has a concentration distribution in the plane direction. As a matter of course, when the dispersion of the first material, such as aluminum, is promoted by heat treatment or the like, the concentration distribution of the first material is reduced.

The porous material is amorphous near the wall surface and in the interior of the wall of each pore.

Examples of the second material include C, Si, SiGe, Ge and a combination thereof.

The structure of the area 2 forming the porous material of the present invention is amorphous and the form of the pore portion, when viewed from above the substrate, may be almost circular, as shown in FIG. 1A, oval, or the like.

The form of the pore portion forming the silicon porous material of the present invention, when viewed from the section of the substrate, may be rectangular as shown in FIG. 1B, square, trapezoidal, or the like.

Preferably, the plurality of pores have substantially the same depth direction. The above area 2 may contain aluminum.

According to the present invention, the aspect ratio (length/diameter) or the ratio of the length of the pore to the diameter of the pore can be set to 0.1 to 10,000.

The porous material of the present invention is characterized in that it is obtained by removing the first material from a structure containing the first material and the second material, the structure has columnar members containing the first material and surrounded by an amorphous area containing the second material, and the second material is contained in the structure in an amount of 20 to 70 atomic % based on the total amount of the first material and the second material.

For example, the first material is aluminum, and the second material is Si, Ge, SiGe, C or a combination thereof.

The silicon porous material of the present invention has pores, which have an average diameter of 20 nm or less and an average interval of 30 nm or less and which are perpendicular or almost perpendicular to the film surface. The pores are columnar, have an aspect ratio (length/diameter), which is the ratio of the length of the pore to the diameter of the pore, of 0.1 to 10,000 and are separated from one another by the silicon area containing silicon as the main component.

FIG. 1A and FIG. 1B are schematic diagrams showing an example of the porous material of the present invention. FIG. 1A is a schematic plan view showing that pores have an average diameter of 20 nm or less and an average interval between the pores adjacent to each other is 30 nm or less, and the pores are independent from one another and are perpendicular or almost perpendicular to the film plane. FIG. 11B is a schematic sectional view cut on broken line 1B—1B of FIG. 1A of the porous material. In FIG. 1A and FIG. 1B, reference numeral 1 denotes a pore (nano-hole), 2 an area and 3 a substrate.

The porous material of the present invention is composed of the pores 1 and the area 2. The pores are separated from one another, independent from one another without being connected to one another and formed perpendicular or almost perpendicular to the substrate as shown in FIG. 1B.

The shape of each pore forming the porous material of the present invention is columnar as shown in FIG. 1B. The diameter 2r (the average diameter of the pores, when viewed from the film plane) of the pores is 20 nm or less, and the interval 2R between adjacent pores (the average interval between the centers of adjacent pores, when viewed from the film plane) is 30 nm or less. Preferably, the pore diameter 2r is 0.5 to 15 nm and the interval 2R between the centers of adjacent pores is 5 to 20 nm. The length L is 0.5 to several micrometers, preferably 2 nm to 5 μm. The average diameter of the pores means the average diameter of long axes obtained by processing (picking out) an image of pore portions observed from the actual SEM photo (about 100 nm×70 nm) using a computer and analyzing the image based on the assumption that the pores are oval.

The pores in the porous material can be directly connected to the substrate as shown in FIG. 1B. The present invention is not limited to this structure, and the pores need not be connected to the substrate.

The area forming the porous material of the present invention contains silicon as the main component, but it may contain other elements, such as aluminum (Al), oxygen (O) and argon (Ar) in an amount of several to several tens of atomic %.

The structure of the porous material of the present invention must be amorphous. The form of the pore portion forming the silicon porous material of the present invention, when viewed from above the substrate, may be almost circular, as shown in FIG. 1A, oval, or the like.

The form of the pore portion forming the silicon porous material of the present invention, when viewed from the section of the substrate, may be rectangular, as shown in FIG. 1B, square, trapezoidal, or the like.

The aspect ratio (length/diameter), which is the ratio of the length of the pore to the diameter of the pore, is 0.1 to 10,000, preferably 0.5 to 1,000.

The present invention is described below by specifying the materials. It is to be understood that the present invention is not limited to these materials.

(3-1) Silicon Porous Material

A silicon porous material of the present invention is a silicon porous material having columnar pores and a silicon area surrounding the pores, in which the average diameter of the pores is 20 nm or less, and the average interval between adjacent pores is 30 nm or less.

Preferably, the above porous material is a film-like silicon porous material having columnar pores and a silicon area containing silicon, in which the pores are formed perpendicular or almost perpendicular to the film plane; the average diameter of the pores is 20 nm or less; the average interval between adjacent pores is 30 nm or less; the aspect ratio (length/diameter), which is the ratio of the length of the pore to the diameter of the pore, is 0.1 to 10,000; and the pores are separated from one another by the silicon area containing silicon as the main component. An oxide film may be formed on the surface of the above silicon area.

Preferably, the average diameter of the pores is 1 to 15 nm, and the average interval between adjacent pores is 5 to 20 nm.

The above silicon area preferably contains silicon in an amount of 80 atomic % or more. This amount does not include the amount of oxygen.

The above silicon area preferably contains at least silicon and aluminum.

The above silicon is preferably an amorphous silicon.

(3-2) Germanium Porous Material

A germanium porous material of the present invention is a germanium porous material having columnar pores and a germanium area surrounding the pores, in which the average diameter of the pores is 20 nm or less, and the average interval between adjacent pores is 30 nm or less.

Preferably, the above porous material is a film-like germanium porous material having columnar pores and a germanium area containing germanium as the main component, in which the pores are formed perpendicular or almost perpendicular to the film plane; the average diameter of the pores is 20 nm or less; the average interval between adjacent pores is 30 nm or less; the aspect ratio (length/diameter), which is the ratio of the length of the pore to the diameter of the pore, is 0.1 to 10,000; and the pores are separated from one another by the germanium area containing germanium.

Preferably, the average diameter of the pores is 1 to 15 nm, and the average interval between adjacent pores is 5 to 20 nm.

The above germanium area preferably contains germanium in an amount of 80 atomic % or more. This amount does not include the amount of oxygen.

The above germanium area preferably contains at least germanium and aluminum.

The above germanium is preferably an amorphous germanium.

(3-3) Silicon Germanium Porous Material

A silicon germanium porous material of the present invention is a silicon germanium porous material having columnar pores and a silicon germanium area surrounding the pores, in which the average diameter of the pores is 20 nm or less; and the average interval between adjacent pores is 30 nm or less.

Preferably, the above porous material is a film-like porous material having columnar pores and a silicon germanium area containing silicon germanium, in which the pores are formed perpendicular or almost perpendicular to the film plane; the average diameter of the pores is 20 nm or less; the average interval between adjacent pores is 30 nm or less; the aspect ratio (length/diameter), which is the ratio of the length of the pore to the diameter of the pore, is 0.1 to 10,000; and the pores are separated from one another by the silicon germanium area containing silicon germanium as the main component.

Preferably, the average diameter of the pores is 1 to 15 nm, and the average interval between adjacent pores is 5 to 20 nm.

The above silicon germanium area preferably contains silicon and germanium in a total amount of 80 atomic % or more. This amount does not include the amount of oxygen.

The ratio of silicon (Si) to germanium (Ge) in the above silicon germanium area preferably satisfies 0<x<1, when it is expressed as $Si_xGe_{1-x}$.

The above silicon germanium is preferably an amorphous silicon germanium.

(4) Porous Material Production Process of the Present Invention

Figure 2A:
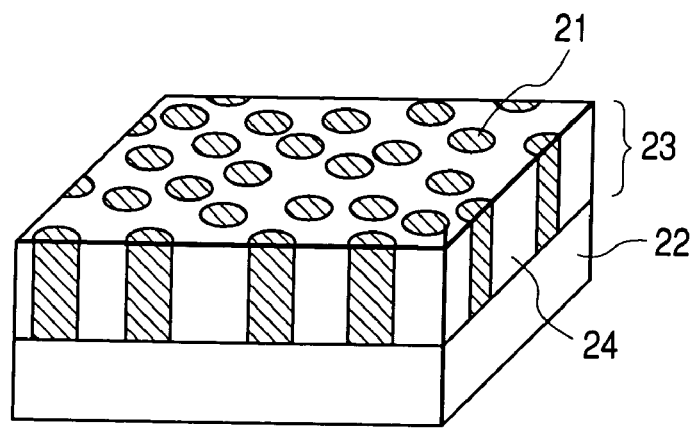
FIGS. 2A, 2B and 2C are diagrams for explaining an example of a process for producing a porous material according to the present invention.
Figure 2B:
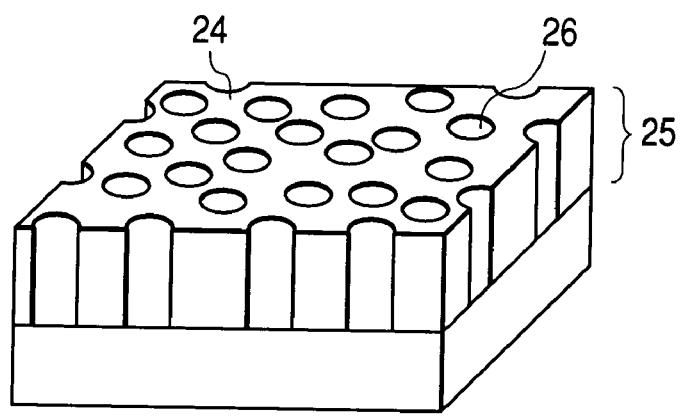
Figure 2C:
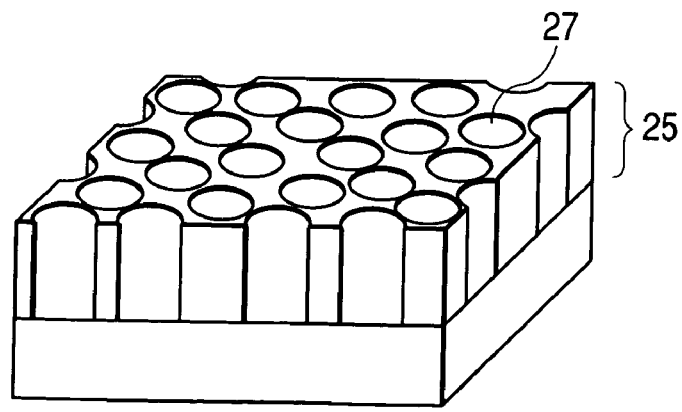

A porous material production process of the present invention includes the step of preparing a structure which contains a first material and a second material in which columnar members containing the first material are surrounded by an area containing the second material (FIG. 2A) and the step of removing the columnar members from the structure (FIG. 2B). In FIG. 2A, FIG. 2B and FIG. 2C, reference numeral 21 denotes the columnar member containing the first material; 24, the area surrounding the columnar members; 22, a substrate; 23, the structure; 25, a porous material; and 26, a pore.

The second material is preferably contained in the structure in an amount of 20 to 70 atomic % based on the total amount of the first material and the second material. If a structure in which columnar structures arranged in a direction perpendicular to the substrate are dispersed in the area is obtained, the amount of the second material is not limited to the above value. In the present invention, it is important that the above structure be obtained by a combination of materials which enable the above columnar structures to be selectively removed from the structure.

As shown in FIG. 2B, after the formation of the pores, the pores can be expanded as required (FIG. 2C).

The above first material is, for example, aluminum or gold, and the second material is, for example, Si, SiGe, Ge, C or a combination thereof. A plurality of different materials may be combined. The same shall apply to the following description.

Figure 3:
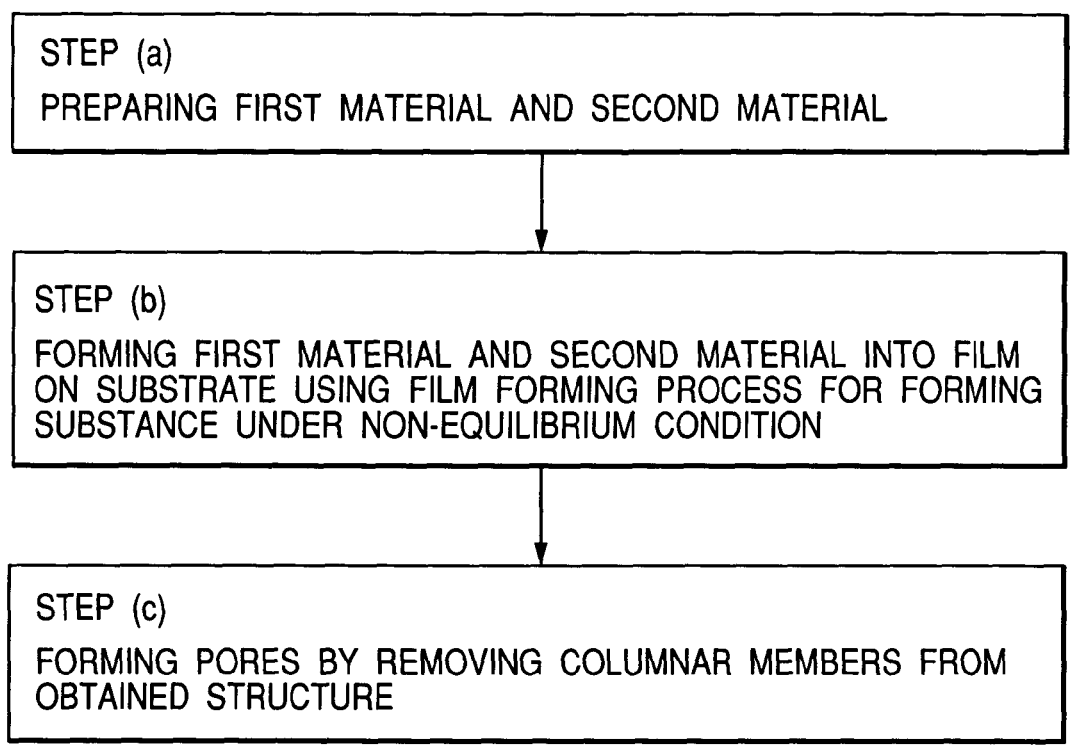
FIG. 3 is a diagram for explaining an example of a process for producing a porous material according to the present invention.

In FIG. 3, the porous material production process of the present invention includes the following steps (a) to (c).

Step (a): preparing a first material (for example, aluminum) and a second material (for example, silicon) (FIG. 3A).

Step (b): forming a film from the above two materials on a substrate by using a film forming process for forming a substance under a non-equilibrium condition (FIG. 3B). A structure obtained by the above process includes columnar members containing the first material and an area containing the second material surrounding the columnar members. Film formation is carried out to ensure that the second material is contained in an amount of 20 to 70 atomic % based on the total amount of the first material and the second material in order to obtain a structure having columnar members dispersed therein.

Step (c): forming pores by removing the columnar members from the obtained structure (FIG. 3C). When wet etching is carried out with an acid or alkali, which can dissolve the first material more easily than the second material, the columnar members formed mainly from the first material are removed to form pores.

As for the removal of the above columnar members by etching or the like, substantially the columnar members may be selectively removed, but the columnar members do not need to be removed along the entire length in the depth direction.

Following the above step (c), wet etching with an acid or alkali which dissolves the second material may be carried out to increase the diameters of the formed pores.

A process for producing a porous material according to the present invention is described below with reference to the drawings.

FIG. 4A, FIG. 4B, FIG. 4C and FIG. 4D are diagrams for explaining the process for producing a porous material according to the present invention. The process will be described in the order of the steps (a) to (d) of FIG. 4A, FIG. 4B, FIG. 4C and FIG. 4D.

The following steps (a) to (d) correspond to FIG. 4A, FIG. 4B, FIG. 4C and FIG. 4D, respectively.

Step (a): preparing a first material (for example, aluminum) and a second material (for example, silicon) in a film forming apparatus.

As shown in FIG. 5, for example, chips 13 made from the second material (for example, silicon) are mounted on a target 12 (substrate) made from the first material (for example, aluminum).

Step (b): Formation of a Structure

The structure 23 is formed on the substrate 22 by a film forming process. Sputtering is used as the film forming process for forming a substance under a non-equilibrium condition.

The structure 23 is formed on the substrate 22 by magnetron sputtering, which is the film forming process for forming a substance under a non-equilibrium condition. The structure 23 is composed of columnar members 21 containing the first material as the main component and an area 24, which surrounds the columnar members 21 and contains the second material as the main component.

With reference to FIG. 5, the process for forming a structure according to the present invention using sputtering as the process for forming a film under a non-equilibrium condition is described below.

In FIG. 5, reference numeral 11 denotes a substrate and 12 a sputtering target containing the first material. When sputtering is used, the ratio of the first material to the second material can be easily changed.

As shown in FIG. 5, the structure is formed on the substrate 11 by magnetron sputtering, which is the film forming process for forming a substance under a non-equilibrium condition.

The second material and the first material, as raw materials, can be prepared by placing chips 13 made from the second material on the target substrate 12 containing the first material, as shown in FIG. 5. In FIG. 5, a plurality of chips is mounted, but the present invention is not limited to this structure. One chip may be mounted on the target if desired film formation is possible. To disperse columnar members in the area 24 uniformly, the chips must be arranged on the substrate 12 symmetrically.

A sintered product manufactured by baking predetermined amounts of the first material powders (for example, aluminum) and the second material powders (for example, silicon) may be used as a target material for film formation.

For instance, an aluminum target and a silicon target may be separately prepared and both targets may be sputtered at the same time.

The amount of the second material contained in the formed film is 20 to 70 atomic %, preferably 25 to 65 atomic %, more preferably 30 to 60 atomic % based on the total amount of the first material and the second material. When the amount of the second material is within the above range, a structure having the columnar members dispersed in the area 24 is obtained.

"Atomic %" indicating the above proportion shows the proportion of the second material (for example, silicon) to the first material (for example, aluminum) in terms of the number of atoms, also expressed as "atom %" or "at %", and a value obtained by quantitatively analyzing the amounts of the two materials in the structure by inductive coupled plasma emission spectral analysis (ICP).

"Atomic %" is used as the unit for expressing the above proportion. When wt % is used as the unit and the amount of silicon is 20 to 70 atomic %, it is 20.65 to 70.84 wt % (conversion from atomic % into wt % is carried out by obtaining the weight ratio of Al to Si on the basis that the atomic weight of Al is 26.982 and the atomic weight of Si is 28.086 and then multiplying the obtained weight ratio by the atomic % value).

The substrate temperature is 300° C. or lower, preferably 200° C. or lower.

When the above structure is formed by the above process, the first material and the second material become a metastable eutectic structure, whereby the first material forms nano-structures as large as several nanometers (pillar-like members) in the matrix formed from the second material and separates due to its self-organization phenomenon. The pillar-like members are almost columnar with a diameter of 1 to 20 nm and an interval of 5 to 30 nm.

The amount of the second material contained in the structure can be controlled by changing the amount of chips mounted on the target made from the first material.

When film formation is carried out under a non-equilibrium condition, in the case of sputtering in particular, the inside pressure of a reactor is 0.2 to 1 Pa, preferably 0.1 to 1 Pa, when argon gas is blown. The output for forming plasma is preferably about 150 to 1,000 W for a 4-inch target. However, the present invention is not limited to these values. Any pressure and output are acceptable, so long as argon plasma is stably formed.

Examples of the substrate include insulating substrates, such as quartz glass and plastic substrates; semiconductor substrates, such as silicon and gallium arsenide substrates; metal substrates; carbon substrates; and substrates having one or more film layers formed thereon. The material, thickness, mechanical strength, and the like of the substrate are not particularly limited unless they are inconvenient for the formation of the structure of the present invention. The form of the substrate is not limited to a flat plate-like form, and the substrate may have a curved surface or a somewhat uneven or stepped surface. The form of the substrate is not particularly limited unless it is inconvenient for the structure. A flexible substrate made from a polyimide resin may also be used. In the case of a silicon substrate, a P type, N type, high-resistance or low-resistance substrate may be used.

The film forming process for forming a substance under a non-equilibrium condition is preferably sputtering, but any film forming process for forming a substance under a non-equilibrium condition, such as resistance heating deposition or electron beam deposition (EB deposition), may be used. Sputtering is preferably carried out in such a state that plasma does not substantially contact with the substrate from which the above structure grows.

As the film forming process there may be used a simultaneous film forming process in which the first material and the second material are formed simultaneously or a laminate forming process in which several atomic-layers of both materials are formed sequentially.

The structure 23 formed as described above has columnar members 21 containing the first material as the main component and a silicon area 24 containing the second material as the main component surrounding the columnar members.

The columnar members 21 contain the first material as the main component, but may contain other elements, such as silicon, oxygen and argon, if columnar microstructures are obtained. It is desirable that the amount of the main component, for example, aluminum, is 80 atomic % or more, preferably 90 atomic % or more, in terms of the component ratio of the columnar member. This amount does not include the amount of oxygen.

The area 24 surrounding the columnar members contains the second material as the main component, but may contain other elements, such as aluminum, oxygen and argon, if columnar microstructures are obtained. The amount of the main component (for example, the second material) is 80 atomic % or more, preferably 90 atomic % or more, in terms of the ratio of components of the area 24.

Step (c): Formation of Pores

The columnar members contained in the above structure are selectively removed. As a result, the area 24 having pores remains in the above structure to form a porous material 25.

The pores in the silicon porous material have an interval 2R of 30 nm or less and a diameter 2r of 20 nm or less, preferably a diameter 2r of 1 to 15 nm and an interval 2R of 5 to 20 nm. The pores have a length L of 0.5 nm to several micrometers, preferably 2 to 1,000 nm.

The solution used for etching is a solution of an acid, which dissolves aluminum, but rarely dissolves silicon, such as phosphoric acid, sulfuric acid, hydrochloric acid or chromic acid. An alkali, such as sodium hydroxide, may also be used unless it is inconvenient for the formation of pores by etching. The present invention is not limited by the type of an acid and the type of an alkali. A solution of a mixture of several acids or a mixture of several alkalis may also be used. Etching conditions, such as solution temperature, concentration and time, may be suitably selected according to a silicon porous material to be manufactured.

According to the present invention, an oxide is not formed on the whole porous material, but an oxide can be selectively formed near the surface of the wall of each pore.

Note that an oxide area can be formed on the wall of each pore of the porous material obtained through the above steps.

The following step (d) may be carried out optionally.

Step (d): Expansion of Pore Diameter

The diameters of the pores can be suitably increased by a pore widening treatment, for example, immersing the above porous material in a solution of an acid which dissolves the second material, such as a solution of hydrogen fluoride or a solution of an alkali, such as sodium hydroxide. Any acid or alkali may be used for the solution, so long as the solution has no problem with the widening of the pores. A solution of a mixture of several acids or a mixture of several alkalis may also be used.

Pore diameter expansion (pore widening) conditions, such as solution temperature, concentration and time, can be suitably selected according to the sizes of pores to be formed.

(4-1) Process for Producing a Silicon Porous Material

A process for producing a silicon porous material according to the present invention includes the step of preparing an aluminum silicon structure which contains aluminum and silicon, has columnar members containing aluminum and a silicon area surrounding the columnar members, and contains silicon in an amount of 20 to 70 atomic % based on the total amount of aluminum and silicon, and the step of removing the columnar members containing aluminum from the aluminum silicon structure.

Preferably, the above process for producing a porous material includes (a) the step of preparing aluminum and silicon, (b) the step of forming aluminum and silicon into an aluminum silicon structure, which has columnar members containing aluminum and a silicon area surrounding the columnar members and which contains silicon in an amount of 20 to 70 atomic % based on the total amount of aluminum and silicon, by using a film forming process for forming a substance under a non-equilibrium condition, and (c) the step of forming pores by etching aluminum from the aluminum silicon structure.

The etching is preferably wet etching with an acid or alkali.

More preferably, the above process for producing a porous material includes (a) the step of preparing aluminum and silicon, (b) the step of forming aluminum and silicon into an aluminum silicon structure, which has columnar members containing aluminum and a silicon area surrounding the columnar members and which contains silicon in an amount of 20 to 70 atomic % based on the total amount of aluminum and silicon, by using a film forming process for forming a substance under a non-equilibrium condition, (c) the step of forming pores by etching aluminum from the aluminum silicon structure, and (d) the step of expanding the diameters of the pores.

The step of expanding the pores is preferably wet etching with an acid or alkali.

The film forming process for forming a substance under a non-equilibrium condition is preferably sputtering.

(4-2) Process for Producing a Germanium Porous Material

A process for producing a germanium porous material according to the present invention includes the step of preparing an aluminum germanium structure, which contains aluminum and germanium, has columnar members containing aluminum and a germanium area surrounding the columnar members, and contains germanium in an amount of 20 to 70 atomic % based on the total amount of aluminum and germanium, and the step of removing the columnar members containing aluminum from the aluminum germanium structure.

Preferably, the process for producing a porous material includes (a) the step of preparing aluminum and germanium, (b) the step of forming aluminum and germanium into an aluminum germanium structure, which has columnar members containing aluminum and a germanium area surrounding the columnar members and which contains germanium in an amount of 20 to 70 atomic % based on the total amount of aluminum and germanium, by using a film forming process for forming a substance under a non-equilibrium condition, and (c) the step of forming pores by etching aluminum from the aluminum germanium structure.

The etching is preferably wet etching with an acid or alkali.

More preferably, the process for producing a porous material includes (a) the step of preparing aluminum and germanium, (b) the step of forming aluminum and germanium into an aluminum germanium structure, which has columnar members containing aluminum and a germanium area surrounding the columnar members and which contains germanium in an amount of 20 to 70 atomic % based on the total amount of aluminum and germanium, by using a film forming process for forming a substance under a non-equilibrium condition, (c) the step of forming pores by etching aluminum from the aluminum germanium structure, and (d) the step of expanding the diameters of the pores.

The step of expanding the pores is preferably carried out by wet etching with an acid or alkali.

The film forming process for forming a substance under a non-equilibrium condition is preferably sputtering.

(4-3) Process for Producing a Silicon Germanium Porous Material

A process for producing a silicon germanium porous material according to the present invention includes the step of preparing an aluminum silicon germanium structure, which contains aluminum, silicon and germanium, has columnar members containing aluminum and a silicon germanium area surrounding the columnar members containing aluminum, and contains silicon and germanium in a total amount of 20 to 70 atomic % based on the total amount of aluminum, silicon and germanium; and the step of removing the columnar members containing aluminum from the aluminum silicon germanium structure.

Preferably, the process for producing a porous material includes (a) the step of preparing aluminum, silicon and germanium, (b) the step of forming aluminum, silicon and germanium into an aluminum silicon germanium structure, which has columnar members containing aluminum and a silicon germanium area surrounding the columnar members and which contains silicon and germanium in a total amount of 20 to 70 atomic % based on the total amount of aluminum, silicon and germanium, by using a film forming process for forming a substance under a non-equilibrium condition, and (c) the step of forming pores by etching aluminum from the aluminum silicon germanium structure.

The above etching is preferably wet etching with an acid or alkali.

More preferably, the process for producing a porous material includes (a) the step of preparing aluminum, silicon and germanium, (b) the step of forming an aluminum silicon germanium structure, which has columnar members containing aluminum and a silicon germanium area surrounding the columnar members and which contains silicon and germanium in a total amount of 20 to 70 atomic % based on the total amount of aluminum, silicon and germanium, by using a film forming process for forming a substance from aluminum, silicon and germanium under a non-equilibrium condition, (c) the step of forming pores by etching aluminum from the aluminum silicon germanium structure, and (d) the step of expanding the diameters of the pores.

The step of expanding the pores is preferably carried out by wet etching with an acid or alkali.

The above film forming process for forming a substance under a non-equilibrium condition is preferably sputtering.

The proportion of the total amount of silicon and germanium to the total amount of silicon, aluminum and germanium is a value represented by (Si+Ge)/(Si+Ge+Al)×100 (where Si is the amount of silicon, Ge is the amount of germanium and Al is the amount of aluminum). That is, when the total of Si+Ge+Al is 100 atomic %, it is the proportion of (Si+Ge).

The inventors of the present invention have conducted studies on microstructures and have made the following finding.

Specifically, they have discovered that aluminum having a columnar structure is formed in a silicon matrix due to the self-formation phenomenon under predetermined conditions when silicon is added in forming an aluminum film on a substrate by using a film forming process for forming a substance under a non-equilibrium condition, such as sputtering. Then, the inventors have conducted intensive studies based on the above finding and have accomplished the present invention.

As described above, in the step of forming an aluminum silicon structure, the film forming process for forming a substance under a non-equilibrium condition is used because an aluminum silicon structure manufactured by the film forming process for forming a substance under a non-equilibrium condition has a eutectic structure in which aluminum and silicon are metastable and aluminum forms nano-structures (aluminum columnar structures) having a diameter of several nanometers and separates due to self-organization.

The reason why an aluminum silicon film is formed, which film contains silicon in an amount of 20 to 70 atomic % based on the total amount of aluminum and silicon, is that aluminum forms columnar nano-structures only when the amount of silicon falls within the above range. That is, when the amount of silicon is less than 20 atomic % based on the total amount of aluminum and silicon, the diameter or size of structures containing aluminum becomes larger than 20 nm and columnar members containing aluminum are not formed. When the amount of silicon is greater than 70 atomic % based on the total amount of silicon and aluminum, columnar members containing aluminum cannot be seen through an ordinary electron microscope.

In the aluminum silicon structure, only the columnar members containing aluminum can be selectively etched with phosphoric acid, sulfuric acid or hydrochloric acid, whereby pores can be formed in silicon. The above etching is preferably wet etching with an acid or alkali.

In the process for producing a silicon porous material according to the present invention, the film forming process for forming a substance under a non-equilibrium condition is desirably sputtering. By using sputtering, the ratio of aluminum to silicon is maintained more easily than by vacuum deposition.

The diameters of the pores (nano-hole) formed in silicon can be expanded by immersing in a solution which, dissolves silicon or silicon oxide on the surface. The step of expanding the pores is preferably wet etching with an acid or alkali.

In the present invention, the columnar members containing aluminum may also be referred to as "aluminum columnar members".

The silicon porous material according to the present invention is a silicon porous material having columnar pores and a silicon area surrounding the pores, in which the average diameter of the pores is 0.5 to 20 nm, and the average interval between adjacent pores is 30 nm or less.

The above average diameter of the pores is preferably 0.5 to 15 nm.

The average interval is preferably 20 nm or less.

The present invention, which has been attained by using aluminum as the first material for forming the columnar structures and silicon as the second material surrounding the columnar structures, has been described. The present invention can also be attained when the above-described material, for example, C, SiGe, Ge or a combination thereof, is used as the second material.

EXAMPLES

The following examples are provided to further illustrate the present invention.

Example 1

This example is of a silicon porous material having pores with an average interval 2R of 8 nm, an average diameter 2r of 5 nm and a length L of 200 nm.

Figure 4B:
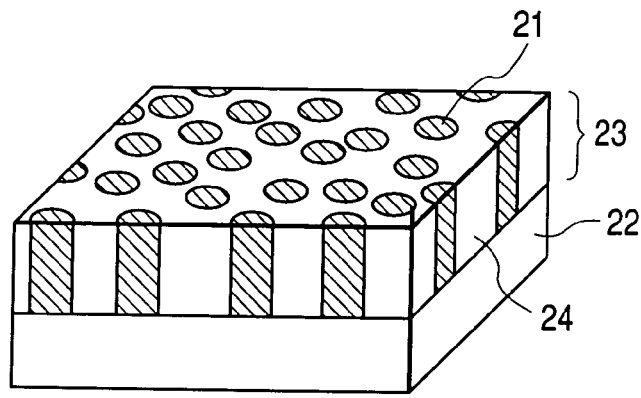

As shown in FIG. 4B, an aluminum silicon structure, which contained silicon in an amount of 37 atomic % based on the total amount of silicon and aluminum, was formed on a glass substrate to a thickness of about 200 nm by magnetron sputtering. Used as a target was a circular aluminum target having a diameter of 4 inches (101.6 mm) and six 15 mm-square silicon chips mounted thereon. As for sputtering conditions, an RF power source was used, the flow rate of Ar was 50 sccm, the discharge pressure was 0.7 Pa and the input power was 1 kW. The substrate temperature was room temperature (25° C.).

The aluminum target having six silicon chips mounted thereon was used as the target, but the number of silicon chips is not limited to six and may be changed by sputtering conditions, so long as the aluminum silicon structure has a silicon content of about 37 atomic %. The target is not limited to an aluminum target having silicon chips mounted thereon, and may be a silicon target having aluminum chips mounted thereon or a target obtained by sintering silicon and aluminum.

The aluminum silicon structure was observed through FE-SEM (field emission scanning electron microscope). When viewed at an oblique angle from above the substrate, the form of the surface of the structure was such that the circular columnar members containing aluminum and surrounded by a silicon area were arranged two-dimensionally as shown in FIG. 4B. The columnar members containing aluminum had a diameter of 5 nm and an average interval between the centers of 8 nm. When the sections of the columnar members were observed through FE-SEM, the columnar members had a length of 200 nm and the columnar members containing aluminum were independent from one another.

The aluminum silicon structure containing silicon in an amount of 37 atomic % based on the total amount of silicon and aluminum was immersed in a 98% solution of concentrated sulfuric acid for 24 hours, and only the aluminum columnar structure portions were selectively etched to form pores. As a result, a silicon porous material was manufactured.

Figure 6:
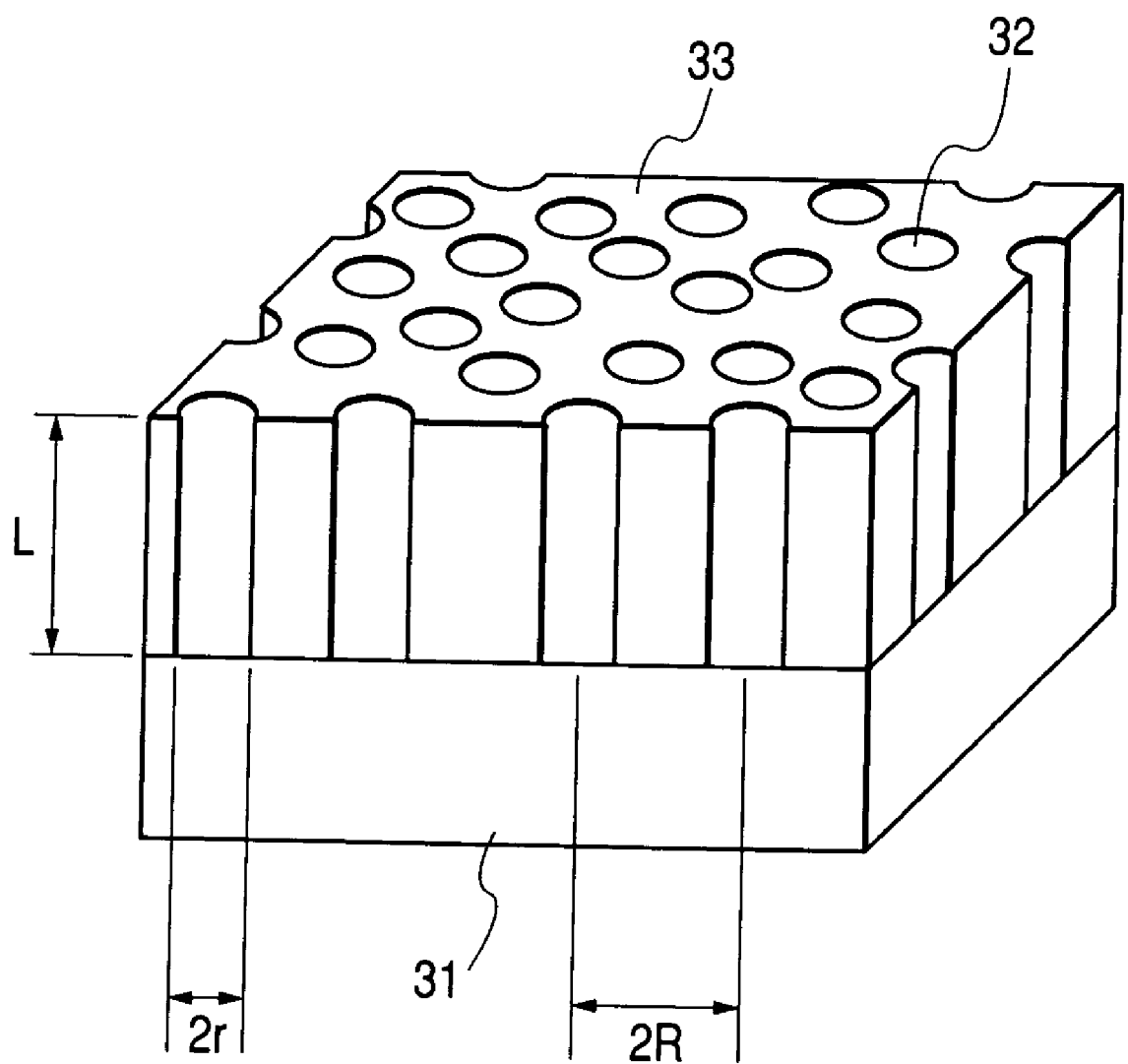
FIG. 6 is a schematic diagram of a porous material according to the present invention.

The aluminum silicon structure (silicon porous material) etched with concentrated sulfuric acid was observed through FE-SEM (field emission scanning electron microscope). When viewed at an oblique angle from above the substrate, the form of the surface of the structure was such that pores 32 surrounded by an area 33 were arranged two-dimensionally, as shown in FIG. 6. The pores had a diameter 2r of 5 nm and an average interval 2R of about 8 nm. When the sections of the pores were observed through FE-SEM, the pores had a length of 200 nm. The pores were separated from one another by silicon and were independent. A film was not formed between the pores and the substrate and was not observed. The pores and the substrate were directly connected to one another.

When the manufactured specimen was measured by an X-ray diffraction method, silicon was amorphous. The amount of silicon in the silicon area was about 90 atomic % based on the total amount of silicon and aluminum.

Silicon was used as the second material in this example, but the above process can be applied when carbon is used as the second material.

Example 2

This example is of a silicon porous material having pores with an average interval 2R of 7 nm, an average diameter 2r of 5 nm and a length L of 200 nm.

As shown in FIG. 4B, an aluminum silicon structure, which contained silicon in an amount of 45 atomic % based on the total amount of silicon and aluminum, was formed on a glass substrate to a thickness of about 200 nm by magnetron sputtering. Used as a target was a circular aluminum target having a diameter of 4 inches (101.6 mm) and eight 15 mm-square silicon chips mounted thereon. As for sputtering conditions, an RF power source was used, the flow rate of Ar was 50 sccm, the discharge pressure was 0.7 Pa and the input power was 1 kW. The substrate temperature was room temperature.

The aluminum target having eight silicon chips mounted thereon was used as the target, but the number of silicon chips is not limited to eight and may be changed by sputtering conditions, so long as the aluminum silicon structure has a silicon content of about 45 atomic %. The target is not limited to an aluminum target having silicon chips mounted thereon, and may be a silicon target having aluminum chips mounted thereon or a target obtained by sintering silicon and aluminum.

The aluminum silicon structure was observed through FE-SEM (field emission scanning electron microscope). When seen obliquely from above the substrate, the form of the surface of the structure was such that circular aluminum columnar structures surrounded by a silicon area were arranged two-dimensionally, as shown in FIG. 4B. The aluminum portions had an average diameter of 3 nm and an average interval of about 7 nm. When the sections of the columnar structure portions were observed through FE-SEM, the columnar structure portions had a length of 200 nm, and the columnar structure portions containing aluminum were independent from one another.

The aluminum silicon structure containing silicon in an amount of 45 atomic % based on the total amount of silicon and aluminum was immersed in a 98% solution of concentrated sulfuric acid for 24 hours, and only the aluminum columnar structure portions were selectively etched to form pores. As a result, a silicon porous material was manufactured.

Figure 4C:
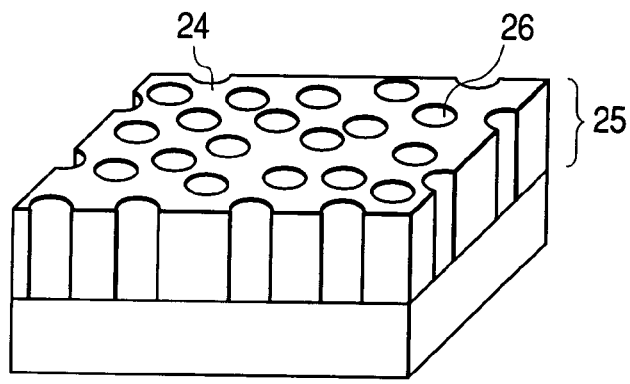
Figure 4D:
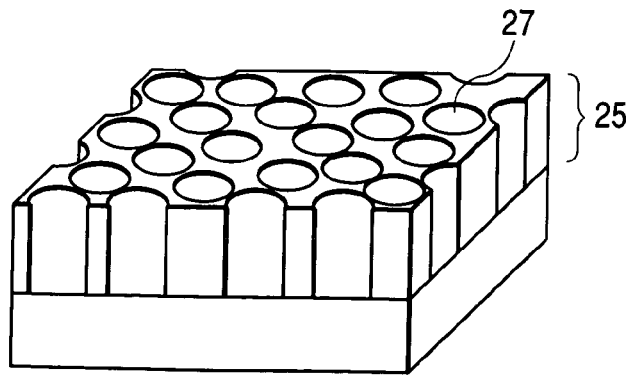

The silicon porous material thus manufactured was observed through FE-SEM (field emission scanning electron microscope). When viewed at an oblique angle from above the substrate, the form of the surface of the structure was such that pores surrounded by silicon were arranged two-dimensionally, as shown in FIG. 4C. The pore portions had an average diameter of about 3 nm and an average interval of about 7 nm. When the sections of the pores were observed through FE-SEM, the pores each had a length of 200 nm. The pores were independent from one another.

To expand the diameter of each pore, the silicon porous material was immersed in a 1 mol/l sodium hydroxide solution maintained at 25° C. for 30 minutes.

The silicon porous material in which the diameter of each pore had been expanded was observed through FE-SEM (field emission scanning electron microscope). When viewed at an oblique angle from above the substrate, the form of the surface of the structure was such that pores 32 surrounded by a silicon area 33 were arranged two-dimensionally, as shown in FIG. 6. The pores had a diameter 2r of 5 nm and an average interval 2R of 7 nm. When the sections of the pores were observed through FE-SEM, the pores had a length of 200 nm. The pores were separated from one another by silicon and were independent. A film was not formed between the pores and the substrate, and the pores and the substrate were directly connected to one another.

When the manufactured specimen was measured by the X-ray diffraction method, a peak showing the crystallinity of silicon could not be observed, and silicon was amorphous. The amount of silicon in the silicon area was about 90 atomic % based on the total amount of aluminum and silicon.

Example 3

This example is of a silicon porous material having pores with an average interval 2R of 8 nm, an average diameter 2r of 5 nm and a length L of 10 nm.

As shown in FIG. 4B, an aluminum silicon structure, which contained silicon in an amount of 37 atomic % based on the total amount of silicon and aluminum, was formed on a glass substrate to a thickness of about 10 nm by magnetron sputtering. Used as a target was a circular aluminum target having a diameter of 4 inches (101.6 mm) and six 15 mm-square silicon chips mounted thereon. As for sputtering conditions, an RF power source was used, the flow rate of Ar was 50 sccm, the discharge pressure was 0.7 Pa and the input power was 1 kW. The substrate temperature was room temperature.

The aluminum target having six silicon chips mounted thereon was used as the target, but the number of silicon chips is not limited to six and may be changed by sputtering conditions, so long as the aluminum silicon structure has a silicon content of about 37 atomic %. The target is not limited to an aluminum target having silicon chips mounted thereon, and may be a silicon target having aluminum chips mounted thereon or a target obtained by sintering silicon and aluminum.

The aluminum silicon structure was observed through FE-SEM (field emission scanning electron microscope). When viewed at an oblique angle from above the substrate, the form of the surface of the structure was such that circular columnar members containing aluminum and surrounded by a silicon area were arranged two-dimensionally, as shown in FIG. 4B. The columnar members containing aluminum had a diameter of 5 nm and an average interval between the centers of 8 nm. When the sections of the columnar members were observed through FE-SEM, the columnar members each had a length of 10 nm, and the columnar members containing aluminum were independent from one another.

The aluminum silicon structure containing silicon in an amount of 37 atomic % based on the total amount of silicon and aluminum was immersed in a 98% solution of concentrated sulfuric acid for 1 hour, and only the aluminum columnar structure portions were selectively etched to form pores. As a result, a silicon porous material was manufactured.

The aluminum silicon structure (silicon porous material) etched with concentrated sulfuric acid was observed through FE-SEM (field emission scanning electron microscope). When viewed at oblique angle from above the substrate, the form of the surface of the structure was such that pores 32 surrounded by a silicon area 33 were arranged two-dimensionally, as shown in FIG. 6. The pores had a diameter of 5 nm and an average interval of about 8 nm. When the sections of the pores were observed through FE-SEM, the pores had a length of 10 nm. The pores were separated from one another by the silicon area and independent. A film was not formed between the pores and the substrate, and the pores and the substrate were directly connected to one another.

When the manufactured specimen was measured by the X-ray diffraction method, a peak showing the crystallinity of silicon could not be observed and silicon was amorphous. The amount of silicon in the silicon area was about 90 atomic % based on the total amount of silicon and aluminum.

As shown in the above examples, according to the present invention, a silicon porous material having pores with an average diameter of 20 nm or less and an average interval of 30 nm or less and separated from one another by a silicon area can be formed by forming an aluminum silicon structure, which has columnar members containing aluminum and a silicon area surrounding the columnar members and which contains silicon in an amount of 20 to 70 atomic % based on the total amount of silicon and aluminum, by using a film forming process for forming a substance under a non-equilibrium condition and by selectively etching only the columnar members containing aluminum from the aluminum silicon structure.

By adjusting the amount of silicon based on the total amount of aluminum and silicon, the size of each pore and the interval between adjacent pores can be controlled, and a silicon porous material having pores perpendicular or almost perpendicular to the substrate and arranged in a large area can be manufactured.

Example 4

This example is of a germanium porous material having pores with an average interval $2R$ of 15 nm, an average diameter $2r$ of 10 nm and a length $L$ of 200 nm.

As shown in FIG. 4B, an aluminum germanium structure, which contained germanium in an amount of 37 atomic % based on the total amount of silicon and germanium, was formed on a glass substrate to a thickness of about 200 nm by magnetron sputtering. Used as a target was a circular aluminum target having a diameter of 4 inches (101.6 mm) and four 15 mm-square silicon chips mounted thereon. As for sputtering conditions, an RF power source was used, the flow rate of Ar was 50 sccm, the discharge pressure was 0.7 Pa and the input power was 300 W. The substrate temperature was room temperature (25° C.).

The aluminum target having four germanium chips mounted thereon was used as the target, but the number of germanium chips is not limited to four and may be changed by sputtering conditions, so long as the aluminum germanium structure has a germanium content of about 37 atomic %. The target is not limited to an aluminum target having germanium chips mounted thereon, and may be a germanium target having aluminum chips mounted thereon or a target obtained by sintering germanium and aluminum powders.

The aluminum germanium structure was observed through FE-SEM (field emission scanning electron microscope). When viewed at an oblique angle from above the substrate, the form of the surface of the structure was such that columnar members containing aluminum, which is substantially circular in its cross-section and surrounded by a silicon area were arranged two-dimensionally, as shown in FIG. 4B. The columnar members containing aluminum had a diameter of 10 nm and an average interval between the centers of 15 nm. When the sections of the columnar members were observed through FE-SEM, the columnar members had a length of 200 nm, and the columnar members containing aluminum were independent from one another.

The aluminum germanium structure containing germanium in an amount of 37 atomic % based on the total amount of aluminum and germanium was immersed in a 98% solution of concentrated sulfuric acid for 24 hours, and only the aluminum columnar structure portions were selectively etched to form pores. As a result, a germanium porous material was manufactured.

The aluminum germanium structure (germanium porous material) etched with concentrated sulfuric acid was observed through FE-SEM (field emission scanning electron microscope). When viewed at an oblique angle from above the substrate, the form of the surface of the structure was such that pores 32 surrounded by a germanium area 33 were arranged two-dimensionally, as shown in FIG. 6. The pores had a diameter $2r$ of 10 nm and an average interval $2R$ of about 15 nm. When the sections of the pores were observed through FE-SEM, the pores had a length of 200 nm. The pores were separated from one another by germanium and were independent.

When the manufactured specimen was measured by the X-ray diffraction method, germanium was amorphous. The amount of germanium in the germanium area was about 90 atomic % based on the total amount of germanium and aluminum.

Example 5

This example is of a germanium porous material having pores with an average interval $2R$ of 15 nm, an average diameter $2r$ of 12 nm and a length $L$ of 200 nm.

As shown in FIG. 4B, an aluminum germanium structure, which contained germanium in an amount of 37 atomic % based on the total amount of aluminum and germanium, was formed on a glass substrate to a thickness of about 200 nm by magnetron sputtering. Used as a target was a circular aluminum target having a diameter of 4 inches (101.6 mm) and four 15 mm-square germanium chips mounted thereon. As for sputtering conditions, an RF power source was used, the flow rate of Ar was 50 sccm, the discharge pressure was 0.7 Pa and the input power was 300 W. The substrate temperature was room temperature.

The aluminum target having four germanium chips mounted thereon was used as the target, but the number of germanium chips is not limited to four and may be changed by sputtering conditions, so long as the aluminum germanium structure has a germanium content of about 37 atomic %. The target is not limited to an aluminum target having germanium chips mounted thereon, and may be a germanium target having aluminum chips mounted thereon or a target obtained by sintering germanium and aluminum.

The aluminum germanium structure was observed through FE-SEM (field emission scanning electron microscope). When viewed at an oblique angle from above the substrate, the form of the surface of the structure was such that circular aluminum columnar structures surrounded by a germanium area were arranged two-dimensionally, as shown in FIG. 4B. The aluminum portions had an average diameter of about 10 nm and an average interval of about 15 nm. When the sections of the columnar structure portions were observed through FE-SEM, the columnar structure portions had a length of 200 nm, and the columnar structure portions containing aluminum were independent from one another.

The aluminum germanium structure containing germanium in an amount of 37 atomic % based on the total amount of aluminum and germanium was immersed in a 98% solution of concentrated sulfuric acid for 24 hours, and only the aluminum columnar structure portions were selectively etched to form pores. As a result, a germanium porous material was manufactured.

The germanium porous material thus manufactured was observed through FE-SEM (field emission scanning electron microscope). When viewed at an oblique angle from above the substrate, the form of the surface of the structure was such that pores surrounded by germanium were arranged two-dimensionally, as shown in FIG. 4C. The pore portions had an average diameter of about 10 nm and an average interval of about 15 nm. When the sections of the pores were observed through FE-SEM, the pores had a length of 200 nm. The pores were independent from one another.

To expand the diameter of each pore, the germanium porous material was immersed in a sodium hydroxide solution having a concentration of 1 mol/l and maintained at 25° C. for 15 minutes.

The germanium porous material in which the diameter of each pore had been expanded was observed through FE-SEM (field emission scanning electron microscope). When viewed at an oblique angle from above the substrate, the form of the surface of the structure was such that pores 32 surrounded by a germanium area 33 were arranged two-dimensionally, as shown in FIG. 6. The pores had a diameter $2r$ of 12 nm and an average interval $2R$ of 15 nm. When the sections of the pores were observed through FE-SEM, the pores had a length of 200 nm. The pores were separated from one another by germanium and were independent.

When the manufactured specimen was measured by the X-ray diffraction method, a peak showing the crystallinity of germanium could not be observed and germanium was amorphous. The amount of germanium in the germanium area was about 90 atomic % based on the total amount of aluminum and germanium.

Example 6

This example is of a germanium porous material having pores with an average interval $2R$ of 15 nm, an average diameter $2r$ of 10 nm and a length L of 10 nm.

As shown in FIG. 4B, an aluminum germanium structure, which contained germanium in an amount of 30 atomic % based on the total amount of aluminum and germanium, was formed on a glass substrate to a thickness of about 10 nm by magnetron sputtering. Used as a target was a circular aluminum target having a diameter of 4 inches (101.6 mm) and three 15 mm-square germanium chips mounted thereon. As for sputtering conditions, an RF power source was used, the flow rate of Ar was 50 sccm, the discharge pressure was 0.7 Pa and the input power was 300 W. The substrate temperature was room temperature.

The aluminum target having three germanium chips mounted thereon was used as the target, but the number of germanium chips is not limited to three and may be changed by sputtering conditions, so long as the aluminum germanium structure has a germanium content of about 30 atomic %. The target is not limited to an aluminum target having germanium chips mounted thereon, and may be a germanium target having aluminum chips mounted thereon or a target obtained by sintering germanium and aluminum.

The aluminum germanium structure was observed through FE-SEM (field emission scanning electron microscope). When viewed at an oblique angle from above the substrate, the form of the surface of the structure was such that circular columnar members containing aluminum and surrounded by a germanium area were arranged two-dimensionally, as shown in FIG. 4B. The aluminum nano-structure portion had a diameter of 12 nm and an average interval between the centers of 15 nm. When the sections of the columnar structure portions were observed through FE-SEM, the columnar structure portions had a length of 10 nm, and the columnar structure portions containing aluminum were independent from one another.

The aluminum germanium structure containing germanium in an amount of 30 atomic % based on the total amount of aluminum and germanium was immersed in a 98% solution of concentrated sulfuric acid for 12 hours and only the aluminum columnar structure portions were selectively etched to form pores. As a result, a germanium porous material was manufactured.

The aluminum germanium structure (germanium porous material) etched with phosphoric acid was observed through FE-SEM (field emission scanning electron microscope). When viewed at an oblique angle from above the substrate, the form of the surface of the structure was such that pores 32 surrounded by a germanium area 33 were arranged two-dimensionally, as shown in FIG. 6. The pores had a diameter $2r$ of 12 nm and an average interval $2R$ of about 15 nm. When the sections of the pores were observed through FE-SEM, the pores had a length of 10 nm. The pores were separated from one another by the germanium area and were independent.

When the manufactured specimen was measured by the X-ray diffraction method, germanium was amorphous. The amount of germanium in the germanium area was about 90 atomic % based on the total amount of aluminum and germanium.

As shown in the above examples, according to the present invention, a germanium porous material having pores with an average diameter of 20 nm or less and an average interval of 30 nm or less and separated from one another by a germanium area can be formed by forming an aluminum germanium structure, which has columnar members containing aluminum and a germanium area surrounding the columnar members and which contains germanium in an amount of 20 to 70 atomic % based on the total amount of germanium and aluminum by using a film forming process for forming a substance under a non-equilibrium condition and by selectively etching only the columnar members containing aluminum from the aluminum germanium structure.

By adjusting the amount of germanium based on the total amount of aluminum and germanium, the size of each pore and the interval between adjacent pores can be controlled and a germanium porous material having pores perpendicular or almost perpendicular to the substrate and arranged in a large area can be manufactured.

Example 7

This example is of a silicon germanium porous material having pores with an average interval 2R of 10 nm, an average diameter 2r of 7 nm and a length L of 200 nm.

As shown in FIG. 4B, an aluminum silicon germanium structure, which contained silicon and germanium in a gross amount of 38 atomic % based on the total amount of aluminum, silicon, and germanium, was formed on a glass substrate to a thickness of about 200 mm by magnetron sputtering. Used as a target was a circular aluminum target having a diameter of 4 inches (101.6 mm) and two 15 mm-square germanium chips and two 15 mm-square silicon chips mounted thereon. As for sputtering conditions, an RF power source was used, the flow rate of Ar was 50 sccm, the discharge pressure was 0.7 Pa and the input power was 300 W. The substrate temperature was room temperature (25° C.).

The aluminum target having two silicon chips and two germanium chips mounted thereon was used as the target, but the number of silicon chips and germanium chips is not limited thereto and may be changed by sputtering conditions, so long as the aluminum silicon germanium structure has a silicon germanium content of about 38 atomic %. The target is not limited to an aluminum target having silicon chips and germanium chips mounted thereon, and may be a silicon target having germanium chips and aluminum chips mounted thereon, a germanium target having silicon chips and aluminum chips mounted thereon, or a target obtained by sintering silicon, germanium, and aluminum powders.

The aluminum silicon germanium structure was observed through FE-SEM (field emission scanning electron microscope). When viewed at an oblique angle from above the substrate, the form of the surface of the structure was such that columnar members containing aluminum, which have a substantially circular cross-section and are surrounded by a silicon germanium area, were arranged two-dimensionally, as shown in FIG. 4B. The columnar members containing aluminum had a diameter of 7 nm and an average interval between the centers of 10 nm. When the sections of the columnar members were observed through FE-SEM, the columnar members had a length of 200 nm and the columnar members containing aluminum were independent from one another.

The aluminum silicon germanium structure containing silicon and germanium in a gross amount of 38 atomic % based on the total amount of aluminum, silicon, and germanium was immersed in a 98% solution of concentrated sulfuric acid for 24 hours and only the aluminum columnar structure portions were selectively etched to form pores. As a result, a silicon germanium porous material was manufactured.

The aluminum silicon germanium structure (silicon germanium porous material) etched with concentrated sulfuric acid was observed through FE-SEM (field emission scanning electron microscope). When viewed at an oblique angle from above the substrate, the form of the surface of the structure was such that pores 32 surrounded by a silicon germanium area 33 were arranged two-dimensionally, as shown in FIG. 6. The pores had a diameter 2r of 7 nm and an average interval 2R of about 10 nm. When the sections of the pores were observed through FE-SEM, the pores had a length of 200 nm. The pores were separated from one another by a mixture of silicon and germanium and were independent.

When the manufactured specimen was measured by the X-ray diffraction method, silicon germanium (mixture member of silicon and germanium) was amorphous. The gross amount of silicon germanium in the silicon germanium area was about 90 atomic % based on the total amount of silicon, germanium, and aluminum.

Example 8

This example is of a silicon germanium porous material having pores with an average interval 2R of 10 nm, an average diameter 2r of 8 nm and a length L of 10 nm.

As shown in FIG. 4B, an aluminum silicon germanium structure, which contained silicon and germanium in a gross amount of 38 atomic % based on the total amount of aluminum, silicon, and germanium, was formed on a glass substrate to a thickness of about 200 nm by magnetron sputtering. Used as a target was a circular aluminum target having a diameter of 4 inches (101.6 mm) and two 15 mm-square silicon chips and two 15 mm-square germanium chips mounted thereon. As for sputtering conditions, an RF power source was used, the flow rate of Ar was 50 sccm, the discharge pressure was 0.7 Pa and the input power was 300 W. The substrate temperature was room temperature.

The aluminum target having two silicon chips and two germanium chips mounted thereon was used as the target, but the number of silicon chips and germanium chips is not limited thereto and may be changed by sputtering conditions, so long as the aluminum silicon germanium structure has a silicon germanium content of about 38 atomic %.

The target is not limited to an aluminum target having silicon chips and germanium chips mounted thereon, and may be a silicon target having germanium chips and aluminum chips mounted thereon, a germanium target having silicon chips and aluminum chips mounted thereon, or a target obtained by sintering silicon, germanium, and aluminum powders.

The aluminum silicon germanium structure was observed through FE-SEM (field emission scanning electron microscope). When viewed at an oblique angle from above the substrate, the form of the surface of the structure was such that circular aluminum columnar structures surrounded by a silicon germanium area were arranged two-dimensionally, as shown in FIG. 4B. The aluminum portions had an average diameter of 7 nm and an average interval between the centers of 10 nm. When the sections of the columnar members were observed through FE-SEM, the columnar members had a length of 200 nm and the columnar members containing aluminum were independent from one another.

The aluminum silicon germanium structure containing silicon and germanium in a gross amount of 38 atomic % based on the total amount of aluminum, silicon, and germanium was immersed in a 98% solution of concentrated sulfuric acid for 24 hours, and only the aluminum columnar structure portions were selectively etched to form pores. As a result, a silicon germanium porous material was manufactured.

The silicon germanium porous material thus manufactured was observed through FE-SEM (field emission scanning electron microscope). When viewed at an oblique angle from above the substrate, the form of the surface of the structure was such that pores surrounded by silicon germanium were arranged two-dimensionally, as shown in FIG. 4C. The pore portions had an average diameter of about 7 nm and an average interval of about 10 nm. When the sections of the pores were observed through FE-SEM, the pores had a length of 200 nm. The pores were independent from one another.

To expand the diameter of each pore, the silicon porous material was immersed in a sodium hydroxide solution having a concentration of 1 mol/l and maintained at 25° C. for 10 minutes.

The silicon germanium porous material in which the diameter of each pore had been expanded was observed through FE-SEM (field emission scanning electron microscope). When viewed at an oblique angle from above the substrate, the form of the surface of the structure was such that pores 32 surrounded by a silicon germanium area 33 were arranged two-dimensionally, as shown in FIG. 6. The pores had a diameter 2r of 8 nm and an average interval 2R of 10 nm. When the sections of the pores were observed through FE-SEM, the pores had a length of 200 nm. The pores were separated from one another by silicon germanium and were independent.

When the manufactured specimen was measured by the X-ray diffraction method, silicon germanium (mixture member of silicon and germanium) was amorphous. The gross amount of silicon and germanium in the silicon germanium area was about 90 atomic % based on the total amount of silicon, germanium, and aluminum.

Example 9

This example is a of silicon germanium porous material having pores with an average interval 2R of 8 nm, an average diameter 2r of 6 nm and a length L of 10 nm.

As shown in FIG. 4B, an aluminum silicon germanium structure, which contained silicon and germanium in a gross amount of 33 atomic % based on the total amount of aluminum, silicon, and germanium, was formed on a glass substrate to a thickness of about 10 nm by magnetron sputtering. Used as a target was a circular aluminum target having a diameter of 4 inches (101.6 mm) and three 15 mm-square silicon chips and one 15 mm-square germanium chip mounted thereon. As for sputtering conditions, an RF power source was used, the flow rate of Ar was 50 sccm, the discharge pressure was 0.7 Pa and the input power was 300 W. The substrate temperature was room temperature.

The aluminum target having three silicon chips and one germanium chip mounted thereon was used as the target but the number of silicon chips and germanium chips is not limited thereto and may be changed by sputtering conditions so far as the aluminum silicon germanium structure has a silicon germanium content of about 33 atomic % in film formation.

The target is not limited to an aluminum target having silicon chips and germanium chips mounted thereon, but may be a silicon target having germanium chips and aluminum chips mounted thereon, a germanium target having silicon chips and aluminum chips mounted thereon, or a target obtained by sintering silicon, germanium, and aluminum powders.

The aluminum silicon germanium structure was observed through FE-SEM (field emission scanning electron microscope). When viewed at an oblique angle from above the substrate, the form of the surface of the structure was such that circular columnar members containing aluminum and surrounded by a silicon germanium area were arranged two-dimensionally, as shown in FIG. 4B. The aluminum nano-structure portion had a diameter of 6 nm and an average interval between the centers of 10 nm. When the sections of the columnar members were observed through FE-SEM, the columnar members had a length of 200 nm and the aluminum columnar structure portions were independent from one another.

The aluminum silicon germanium structure containing silicon and germanium in a gross amount of 33 atomic % based on the total amount of aluminum, silicon, and germanium was immersed in a 98% solution of concentrated sulfuric acid for 1 hour, and only the aluminum columnar structure portions were selectively etched to form pores. As a result, a silicon germanium porous material was manufactured.

The aluminum silicon germanium structure (silicon germanium porous material) etched with concentrated sulfuric acid was observed through FE-SEM (field emission scanning electron microscope). When viewed at an oblique angle from above the substrate, the form of the surface of the structure was such that pores 32 surrounded by a silicon germanium area 33 were arranged two-dimensionally, as shown in FIG. 6. The pores had a diameter of 6 nm and an average interval of about 8 nm. When the sections of the pores were observed through FE-SEM, the pores had a length of 10 nm. The pores were separated from one another by the silicon germanium area and were independent.

When the manufactured specimen was measured by the X-ray diffraction method, silicon germanium was amorphous. The gross amount of silicon and germanium in the silicon germanium area was about 90 atomic % based on the total amount of silicon, germanium, and aluminum.

As shown in the above examples, according to the present invention, a silicon germanium porous material having pores with an average diameter of 20 nm or less and an average interval of 30 nm or less and separated from one another by a silicon germanium area can be formed by forming an aluminum silicon germanium structure, which has columnar members containing aluminum and a silicon germanium area surrounding the columnar members and which contains silicon and germanium in a gross amount of 20 to 70 atomic % based on the total amount of aluminum, silicon, and germanium, by using a film forming process for forming a substance under a non-equilibrium condition and by selectively etching only the columnar members containing aluminum from the aluminum silicon germanium structure.

By adjusting the amount of silicon germanium based on the total amount of aluminum, silicon, and germanium, the size of each pore and the interval between adjacent pores can be controlled, and a silicon germanium porous material having pores perpendicular or almost perpendicular to the substrate and arranged in a large area can be manufactured.

The present invention makes it possible to apply pores contained in silicon, germanium and silicon germanium in various forms, thereby greatly expanding their applicable uses. For example, the silicon, germanium and silicon germanium porous bodies of the present invention can be used as a functional material in light-emitting devices, optical devices and microdevices. They can also be used as a base material or mold for novel nano-structures. Further, they can also be used as a filter or etching mask.

Effect of the Invention

As described above, according to the present invention, there can be provided a novel porous material and a production process thereof.

The invention claimed is:

1. A porous article comprising:
    a substrate; and
    a porous material formed on the substrate, the porous material comprising a plurality of columnar pores and an area surrounding the pores, the area being an amorphous Si or an amorphous $Si_xGe_{1-x}$ ($x \neq 0$),
    wherein the depth direction of the columnar pores is substantially perpendicular to the substrate,
    wherein the columnar pores have a circular or elliptic cross-section in a direction parallel to the substrate, and
    wherein an average interval between centers of adjacent pores is 30 nm or less.

2. The porous article according to claim 1, wherein the columnar pores are substantially unbranched.

3. The porous article according to claim 1, wherein the average diameter of the columnar pores is 20 nm or less.

4. The porous article according to claim 1, wherein the plurality of pores have substantially the same depth direction.

5. The porous article according to claim 1, wherein an oxide film is formed on a wall surface of the columnar pores.

6. The porous article according to claim 1, wherein the area contains aluminum.

7. The porous article according to claim 6, wherein an amount of the aluminum in the area is from 1 to 20 atomic percent.

* * * * *

UNITED STATES PATENT AND TRADEMARK OFFICE
CERTIFICATE OF CORRECTION

PATENT NO.        : 7,070,855 B2
APPLICATION NO. : 10/653978
DATED             : July 4, 2006
INVENTOR(S)       : Kazuhiko Fukutani et al.

It is certified that error appears in the above-identified patent and that said Letters Patent is hereby corrected as shown below:

ON TITLE PAGE AT (56) OTHER PUBLICATIONS

Delete "M. Atzmon et al., "Phase Separation During Film Growth," 42(2) *J. Appl. Phys.* 442-46 (Jul. 1992)."

COLUMN 1

Line 56, "aspect" should read --aspect of--.

COLUMN 9

Line 31, "11B" should read --1B--.

COLUMN 17

Line 64, "which," should read --, which--.

COLUMN 21

Line 61, "silicon" should read --aluminum--; and
Line 65, "silicon" should read --germanium--.

COLUMN 23

Line 41, "1 mol/I" should read --1 mol/1--.

Signed and Sealed this

Twentieth Day of February, 2007

JON W. DUDAS
*Director of the United States Patent and Trademark Office*